(12) United States Patent
Smick et al.

(10) Patent No.: US 6,331,713 B1
(45) Date of Patent: Dec. 18, 2001

(54) MOVABLE ION SOURCE ASSEMBLY

(75) Inventors: Theodore H. Smick, Essex; Marvin Farley, Ipswich; Geoffrey Ryding, Manchester; Shu Satoh, Byfield; Peter Rose, Rockport, all of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/413,035

(22) Filed: Oct. 6, 1999

(51) Int. Cl.[7] ................................. G21F 5/02; G21F 5/10
(52) U.S. Cl. .................... 250/497.1; 250/492.21; 250/492.3; 250/423 R
(58) Field of Search ................................ 250/498.1, 431, 250/424

(56) References Cited

U.S. PATENT DOCUMENTS

| | | | |
|---|---|---|---|
| 4,847,504 | 7/1989 | Aitken | 250/492.2 |
| 5,517,077 * | 5/1996 | Bright et al. | 313/359.1 |
| 5,821,677 | 10/1998 | Benvenise | 313/231.41 |
| 6,132,516 * | 10/2000 | Hayashi et al. | 118/718 |
| 6,137,114 * | 10/2000 | Rohe et al. | 250/497.1 |

* cited by examiner

Primary Examiner—Jack Berman
Assistant Examiner—K. Fernandez
(74) Attorney, Agent, or Firm—Boult Wade Tennant (57) ABSTRACT

An ion source assembly 10 is disclosed, the assembly comprising a source sub assembly having an ion source 20, an extraction electrode 40 and an electrically insulating high voltage bushing 60 to support the extraction electrode 40 relative to the ion source 20. The ion source assembly further includes a chamber 70 having an exit aperture to allow egress of ions to an ion implanter. The chamber 70 encloses one or more further electrodes 80,90. The source sub assembly is mounted to the chamber 70 via a hinge 150. This allows ready access to the inner walls of the chamber 70, which in turn allows easier maintenance and cleaning of the further electrodes 80,90 as well as the inner walls of the chamber 70. Preferably, a liner 160 is employed on the inner walls of the chamber 70.

19 Claims, 7 Drawing Sheets

MOVABLE ION SOURCE ASSEMBLY

FIELD OF THE INVENTION

This invention relates to an ion source assembly, in particular for use in an ion implanter.

BACKGROUND OF THE INVENTION

Ion implanters have been used for many years in the processing of semiconductor wafers. Typically, a beam of ions of a required species is produced and directed at a wafer or other semiconductor substrate, so that ions become implanted under the surface of the wafer. Implantation is typically used for producing regions in the semiconductor wafer of altered conductivity state, by implanting in the wafer ions of a required dopant.

A number of arrangements for generating a source of ions in an ion implanter are known. Hot cathode sources, such as the so-called Freeman or Bernas sources, use a directly heated filament to generate a source of thermionic electrons. The cathode is held at a high negative potential relative to an anti-cathode (usually formed from the walls of an arc chamber) and an arc current flows through an admitted gas supply to generate a plasma.

Alternatively, a microwave or rf source can be used. Here, a microwave or rf field excites free electrons which then ionise an admitted gas to again produce a source of ions for implanting.

In one common arrangement, known as a triode structure, a suppression or extraction electrode is used to extract the ions from the ion source where they are formed. The extraction electrode is arranged adjacent to an extraction aperture formed in a face plate mounted upon the arc chamber of the ion source. The potential difference between the arc chamber and the extraction electrode defines the energy of the resultant ion beam. The triode structure also includes a ground electrode prevent electrons from being swept away and thus allows ion beam neutrality to be preserved. The face plate, suppression or extraction electrode and ground electrode are henceforth termed an extraction assembly.

To permit acceleration of ions out of the ion source, the extraction electrode needs to be at a net negative potential with respect to the ion source itself. Thus, the ion source is typically electrically insulated from the extraction electrode by high voltage bushing formed from, for example, a ceramic based material A second, less common form of ion source assembly employs a tetrode structure. Here, instead of a dual purpose extraction/suppressor electrode such as is used in the triode structure described above, separate suppressor and extraction electrodes are employed. The suppressed electrode is electrically insulated from the suppressor electrode and is held at a net negative potential (for positively charged ions) with respect to it. Examples of tetrode structures are shown in U.S. Pat. No. 5,866,909 and WO99/23685.

In both the triode and tetrode structures, the ion source, isolated from the extraction assembly, is mounted coaxially within a first end of an elongate, usually cylindrical vacuum chamber. The other, second end of the vacuum chamber is mounted, often non-removably, around an inlet into a mass analyser.

The various parts of the ion source assembly (consisting of the ion source, extraction assembly, insulators and vacuum chamber) require frequent cleaning and servicing to prevent contamination of the resultant ion beam. For this reason, the ion source assembly must be dismantled.

Such a process is difficult and time consuming. The trend to larger ion implanters has in turn caused larger ion source assemblies to evolve, which tend to be relatively heavy. To dismantle such assemblies can require two persons or even lifting equipment. Furthermore, the particular shape of some components of typical ion source assemblies can in any event make them difficult to remove without damage. For example, the extraction electrode in the tetrode structure shown in WO99/23685 is mounted upon the base of a 'cup' shaped electrode support of relatively small diameter. The elongate ion source then extends into the cup such that a front face of the ion source is generally parallel with, and adjacent to, the base of the cup (and the extraction electrode in particular). Then, even when the ion source is removed, the extraction electrode can only be accessed via the narrow diameter of the cup.

SUMMARY OF THE INVENTION

It is an object of the present invention to address these and other problems with the prior art. More specifically, it is an object of the invention to provide an ion source assembly permitting easier access to the components thereof. According to the present invention, there is provided an ion source assembly for an ion implanter comprising a source sub assembly including an ion source for generating ions to be implanted; an extraction electrode for extracting ions from the ion source; and a first electrical insulator arranged to support the extraction electrode relative to the ion source and to electrically insulate the said extraction electrode from the ion source; and a chamber having a chamber wall with an inner and outer surface, and being arranged to receive ions extracted from the ion source, the chamber wall defining an exit aperture to permit egress of the said ions to the ion implanter; wherein the source sub assembly is movable relative to the chamber, the ion source assembly further comprising constraining apparatus arranged to connect the chamber wall with the source sub assembly such that the source sub assembly is constrained to move along a fixed locus of points relative to the chamber to allow access to the inner wall thereof, at least some of any loss in the potential energy of the source sub assembly during movement thereof being stored by the said constraining apparatus.

The use of a constraining apparatus, such as for example a hinge, mounted between the first sub assembly and the chamber allows ready access to the internal components of the ion source assembly. In particular, to gain access to the inside of the chamber, the first sub assembly may simply be pulled away from the chamber, the constraining means acting to support the one part relative to the other part. This in turn avoids the problem of having to remove and carry away the bulky ion source, and then the extraction electrode, before access to the inside of the chamber could be gained. The risk of damage to the components of the source sub assembly is likewise reduced.

Preferably, the source sub assembly is movable in use between a first position in which it is fixedly mounted upon the chamber walls and a second position in which it is movable relative to the chamber along the said fixed locus of points. For example, the constraining means may constrain the source sub assembly to move in a substantially horizontal plane, whereby, in the said first position, the weight of the source sub assembly is borne across the chamber, and in the said second position, the weight of the source sub assembly is substantially all borne by the said hinge means. Alternatively, for example, the constraining apparatus may constrain the sub assembly to move in both a horizontal and vertical plane. Then, it is preferable that the constraining apparatus should also include an energy storage device such as a spring or gas strut to store any loss in potential energy of the source sub assembly as it moves downwards in a vertical plane. This stored energy can be utilised when moving the source sub assembly back upwards in a vertical plane to assist the person moving it.

Thus, when the source sub assembly is dismounted from the chamber, the user who wishes to clean the components of the ion source assembly does not need to support the weight of the source sub assembly. The source sub assembly, in the preferred embodiment, acts as a movable "door" hinged upon the chamber which is typically fixedly mounted to the ion implanter.

Preferably, the ion source assembly further comprises extraction electrode support means arranged to support the said extract electrode relative to the said first electrical insulator. In that case, the ion source may be generally elongate and have a first end along the axis of elongation, the said first end preferably including an exit aperture permitting egress of ions, wherein the extraction electrode support means may also be elongate with a first end along the axis of elongation. The extraction electrode may in preference be mounted upon the said first end of the said extraction electrode support means, such that the axes of elongation of the extraction electrode support means and the ion source are generally collinear such that the extraction electrode is located generally parallel with and adjacent to the said exit aperture of the said first end of the ion source.

The use of constraining means mounted between the source sub assembly and the chamber is particularly advantageous in this arrangement. The elongate nature of the ion source and the extraction electrode support means makes access to the extraction electrode from the ion source side (i.e. the side of the extraction electrode which faces the ion source when the assembly is assembled) difficult if the source sub assembly is simply disassembled. By allowing the whole source sub assembly to be moved relative to the chamber it is instead possible to access the extraction electrode from the chamber side, i.e. that side which faces into the chamber.

In preferred embodiments of the present invention, the inner wall of the chamber may be lined with a liner. The use of a liner prevents the build up of ions on the walls of the chamber. As ions instead coat the liner, this can readily be removed and cleaned or replaced. Previously, the time and difficulty of accessing the inside walls of the chamber had prevented wide scale use of such liners.

Preferably, the first end of the ion source constitutes a first electrode, and the said extraction electrode constitutes a second electrode, the assembly further comprising third and fourth electrodes mounted within the said chamber such that the second electrode is located between the first electrode and the third electrode, and the third electrode is located between the second electrode and the fourth electrode. The four electrodes constitute a tetrode structure which is particularly advantageous in "tuning" and focusing the resultant ion beam.

The invention also extends to an ion implanter comprising:
(i) an ion source assembly including a source sub assembly having an ion source for generating ions to be implanted, an extraction electrode for extracting ions from the ion source, and a first electrical insulator arranged to support the extraction electrode relative to the ion source and to electrically insulate the said extraction electrode from the ion source; the ion source assembly further including a chamber having a chamber wall and being arranged to receive ions extracted from the ion source, the chamber wall defining an exit aperture to permit egress of the said ions as an ion beam; and
(ii) a substrate holder downstream of the ion source assembly, the ion beam being directed in use towards the said substrate holder, and the substrate holder being arranged to support at least one substrate to be implanted by the said ion beam; wherein the source sub assembly of the ion source assembly is movable relative to the chamber thereof, the ion source assembly further comprising constraining means arranged to connect the chamber wall with the source sub assembly such that the source sub assembly is constrained to move along a fixed locus of points relative to the chamber to allow access to the inner wall thereof.

The ion implanter may further comprise mass analysing means arranged between the said ion source assembly and the said substrate holder, the chamber of the said ion source assembly being fixedly mountable relative to the mass analysing means.

BRIEF DESCRIPTION OF THE DRAWINGS

The invention may be put into practice in a number of ways, and one preferred embodiment will now be described by way of example only and with reference to the accompanying drawings in which.

DETAILED DESCRIPTION OF THE PREFERRED EMBODIMENT

Figure 1:
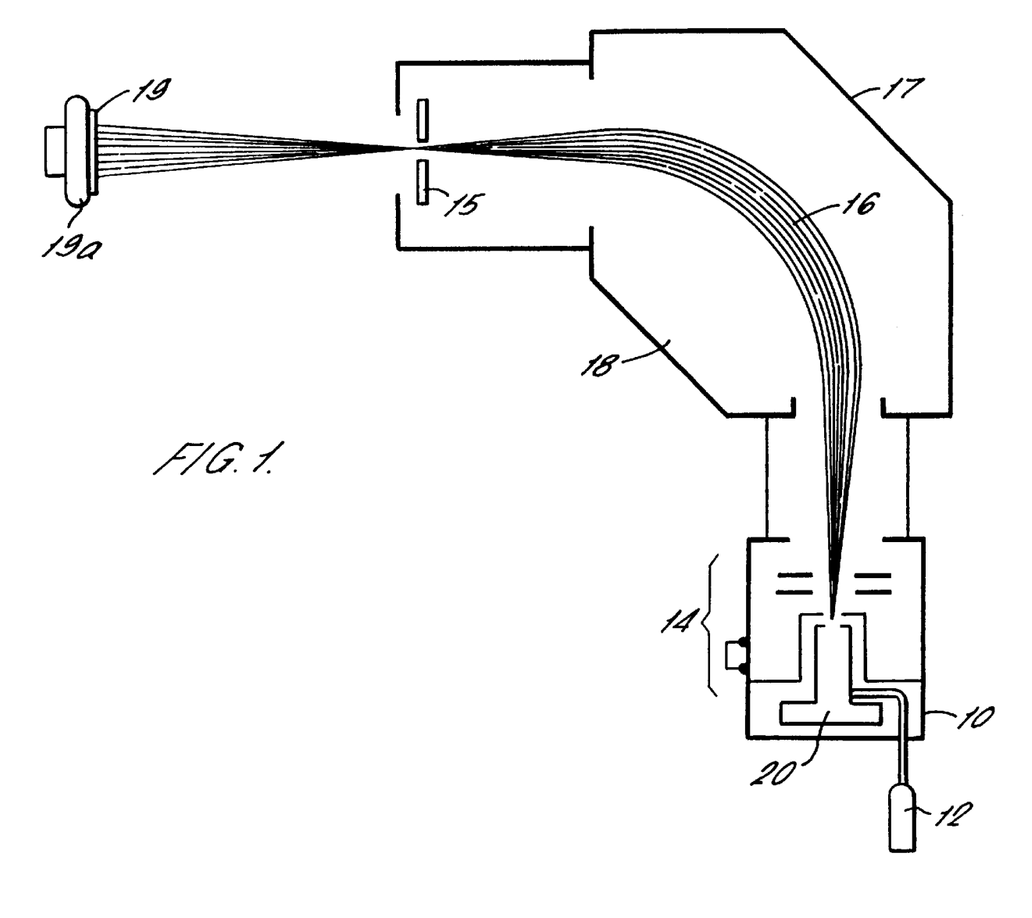
FIG. 1 shows, in schematic section, the layout of an ion implanter.

Referring to FIG. 1, an ion implanter apparatus 1 is shown. The apparatus comprises an ion source assembly 10 in schematic form only, whose structure will be described in more detail in connection with FIGS. 2–5 below. The ion source assembly includes an ion source 20 which is fed with a supply of atoms or molecules from a gas bottle 12, for example. The ion source has an extraction assembly shown generally at 14 from which an ion beam 16 is produced. The ion beam 16 is directed through an ion mass selector 17 including a magnetic analyser 18. Ions of the chosen mass to charge ratio follow a curved path through the magnetic analyser 18 and pass through an exit slit 15 before impinging upon a target substrate 19 mounted upon a substrate holder 19a.

As will be appreciated by the skilled reader, the above elements are all housed in a vacuum housing although this is not shown for clarity.

Figure 2A:
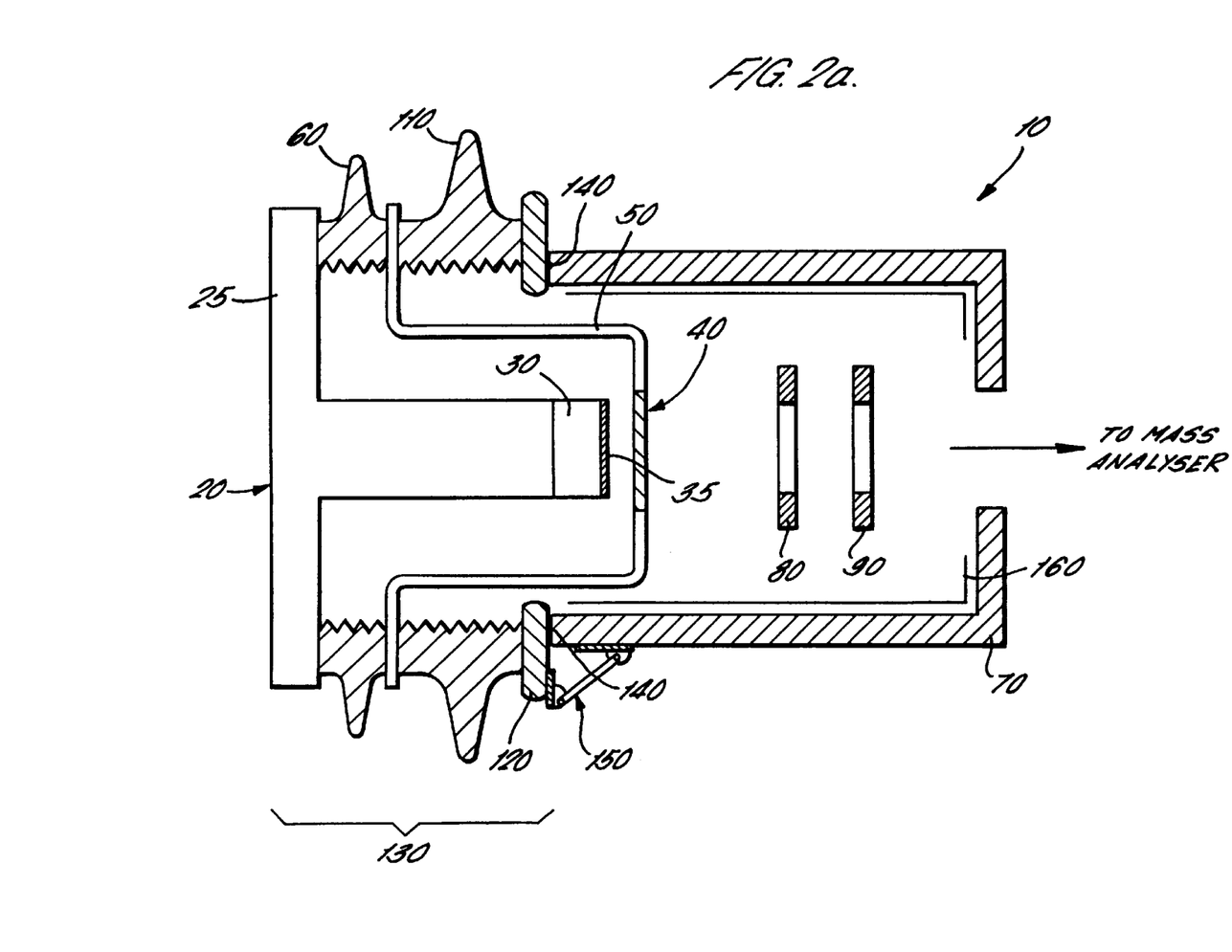
FIGS. 2a and 2b show highly schematic top-down views of an ion source assembly embodying the present invention, in first and second positions respectively.
Figure 2B:
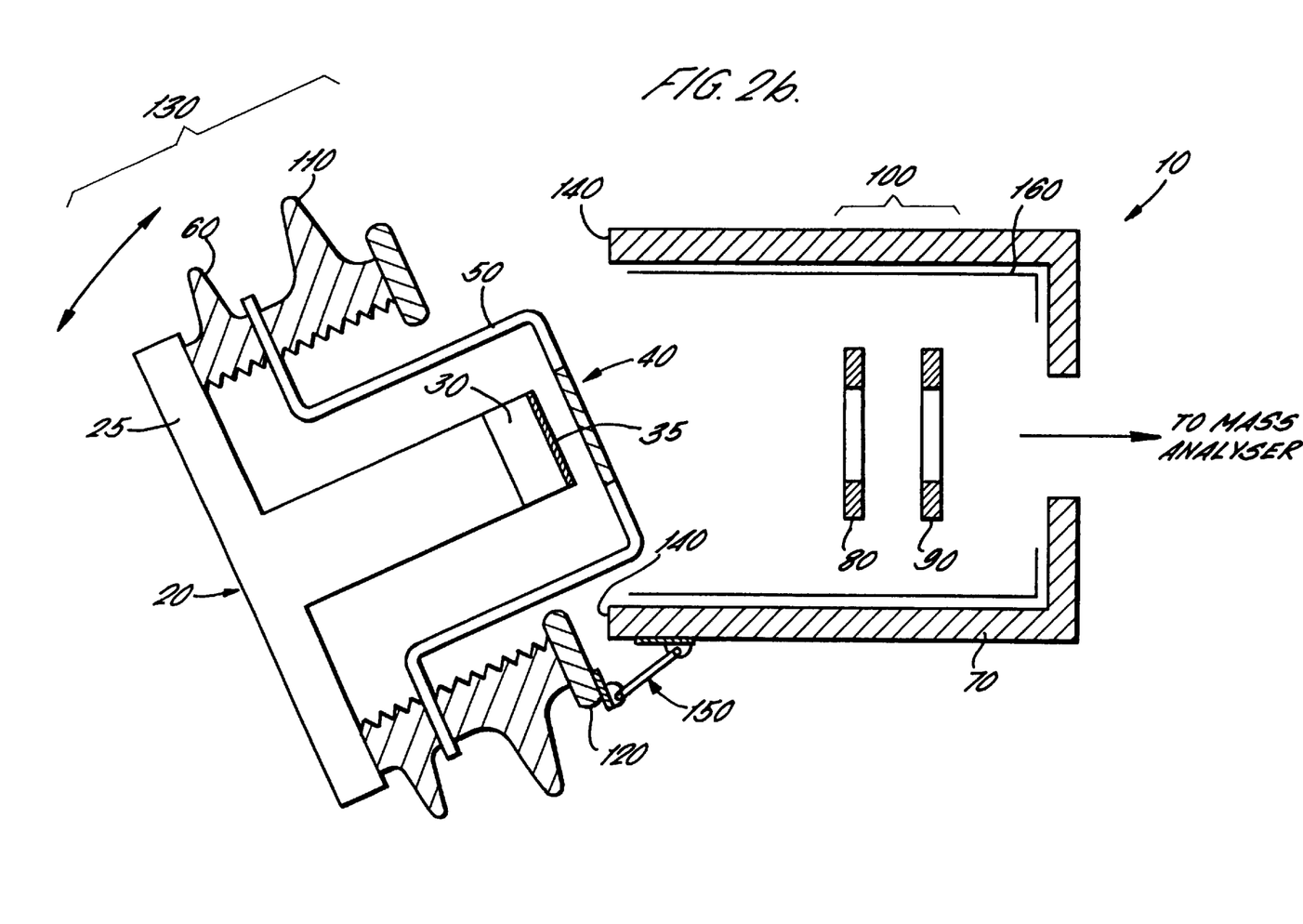
Figure 3A:
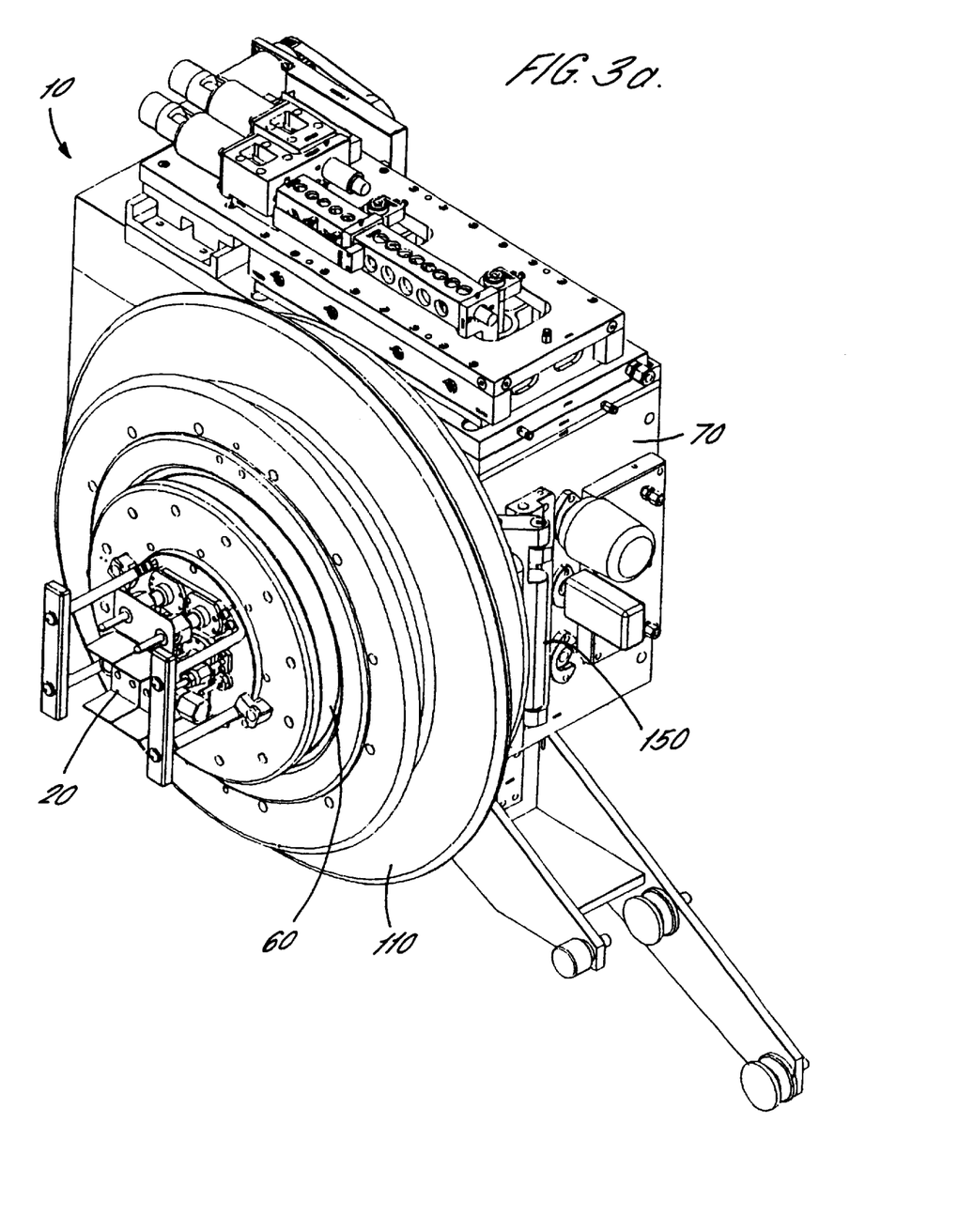
FIGS. 3a and 3b show more detailed, perspective views of the ion source assembly embodying the invention, and including a hinge, the assembly again in first and second positions respectively.
Figure 3B:
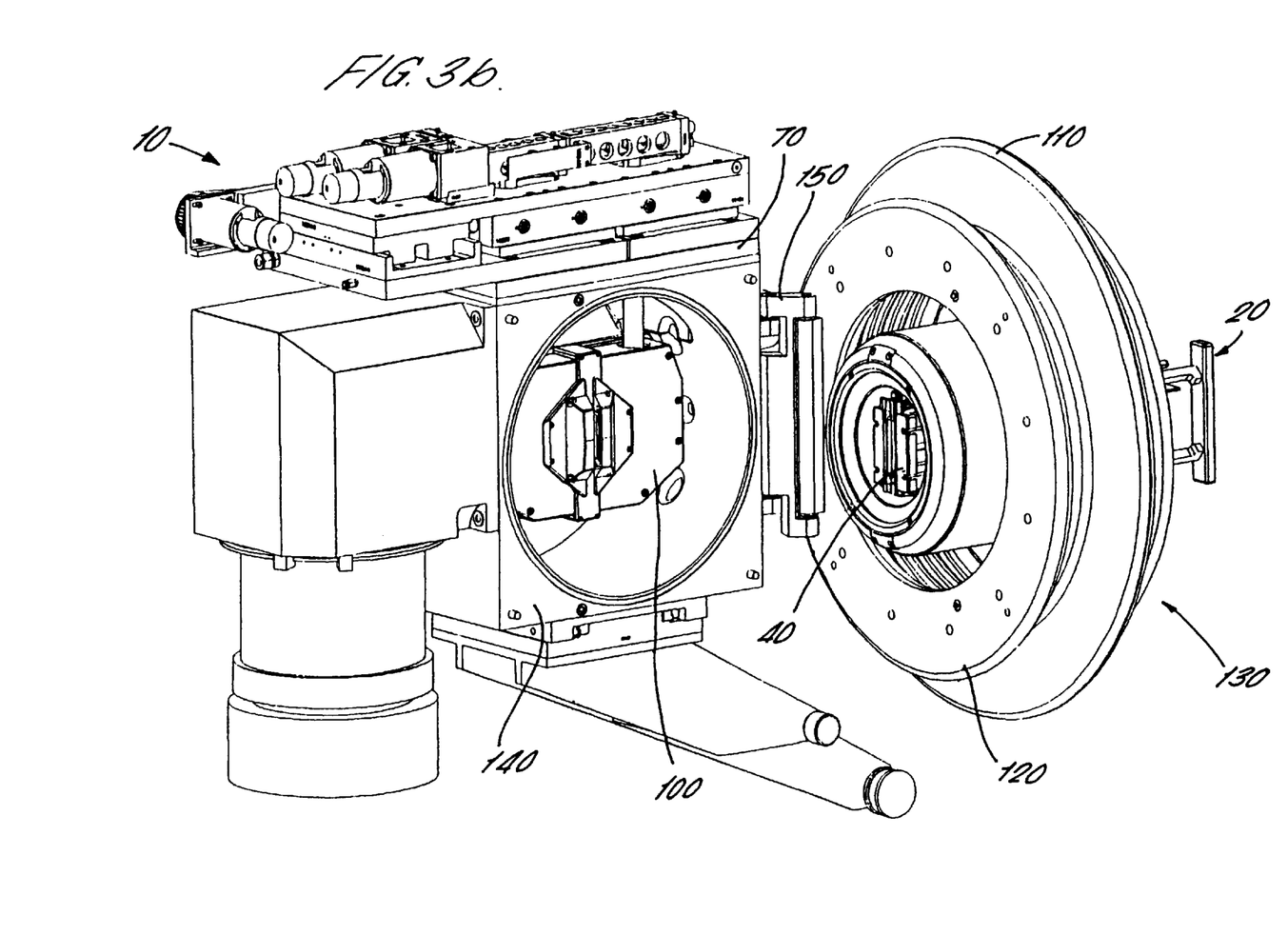

Referring next to FIG. 2a, 2b, 3a and 3b, a schematic plan view of the ion source assembly 10 embodying the present invention is shown in various views. In FIGS. 2a and 3a, the ion source assembly 10 is shown in a first, closed position. FIGS. 2b and 3b show the assembly 10 in a second, open position.

The ion source assembly comprises an ion source 20 which may be of any suitable type such as a Freeman or Bernas source, for example. In the example shown in the Figures, the ion source 20 has a base portion 25, and a generally elongate portion upon that base. The end of the generally elongate portion contains an arc chamber 30. As will be familiar to those skilled in the art, the arc chamber 30 has an aperture therein to allow ions generated within the ion source to exit.

The ion source assembly also includes an extraction electrode 40, which is mounted immediately adjacent the face plate 35 to allow ions formed within the ion source 20 to be extracted in the form of an ion beam. In order to support the extraction electrode 40 next to the face plate 35, an extraction electrode support member 50 is employed. As seen in FIG. 2a, the extraction electrode support member 50 is U-shaped in section, with the base thereof holding the extraction electrode 40.

The ion source 20 is usually at a common potential of a few kV or more. In order to accelerate positive ions away from the arc chamber 30, the extraction electrode 40 needs to be at a net negative potential relative to the potential of the ion source 20. Therefore, both the ion source 20 and the extraction electrode 40 (via the extraction electrode support member 50, which is electrically conducting) are connected to separate voltage supplies (not shown). Furthermore, the extraction electrode support ember 50 is electrically insulated from the base of the ion source 20 by a first high voltage bushing 60, formed from a suitable insulating material. The first high voltage bushing 60 acts not only to separate the extraction electrode support member 50 from the base portion 25 of the ion source 20, but also to support the extraction electrode support member 50 mechanically relative to the ion source base portion 25.

The aperture of the arc chamber 30, and the extraction electrode 40, extend into an evacuatable chamber 70. This chamber 70 contains a suppressor electrode 80 at a net negative potential with respect to the extraction electrode 40. Downstream of the suppressor electrode 80 is a fourth, ground electrode 90. The suppressor and ground electrodes 80,90 together form an extraction assembly 100 (shown in perspective view in FIG. 3b). The purpose of the various electrodes in the tetrode structure does not form part of the present invention and will not be described in further detail.

The chamber 70 and the ground electrode 90 are typically at a common ground potential relative to the ion source 20 and extraction electrode 40. Therefore, it is again necessary to insulate the chamber 70 from the extraction electrode support member 50, and this is accomplished with a second high voltage bushing 110. As with the first high voltage bushing 60, the second high voltage bushing 110 not only electrically insulates the extraction electrode support member 50 from the chamber 70, but also provides mechanical support for the extraction electrode support member 50.

The end face of the second high voltage bushing 110, proximal to the chamber 70, has a bushing flange 120. The ion source 20, extraction electrode 40, extraction electrode support member 50, first high voltage bushing 60, second high voltage bushing 110 and bushing flange 120 together constitute an ion source sub assembly 130, as indicated in FIGS. 2a and 2b. The ion source sub assembly 130 is mounted against an end face 140 of the chamber 70 but movable relative thereto, as will be described in further detail referring in particular to FIGS. 2b and 3b.

In use, the bushing flange 120 of the ion source sub assembly 130 abuts against the end face 140 of the chamber 70. The ion source assembly 10 must be evacuated in use and an O-ring seal (not shown) is therefore employed to allow the bushing flange 120 to form a vacuum-tight seal with the end face 140 of the chamber 70.

A hinge 150 is attached between an outside wall of the chamber 70, and the bushing flange 120. Previously, in order to access the inside of the chamber 70, or the extraction electrode 40, the ion source 20 first had to be lifted away from the assembly 10 by detaching it from the first high voltage bushing 60 and the extraction electrode support member 50. Even then, to access the inside of the chamber 70, the extraction electrode support member 50 also had to be removed. Using the hinge 150, the ion source sub assembly 130 can be rotated away from the chamber 70 by pivoting about the hinge 150. This is shown in FIGS. 2b and 3b. Not only does the hinge 150 allow ready access to the inside of the chamber 70, but it also supports the weight of the ion source sub assembly 1when in the second position shown in FIGS. 2b and 3b, that is, when the bushing flange 120 does not abut the end face 140 of the chamber 70.

The inner walls of the chamber 70 may be lined with a liner 160 which is preferably formed from aluminum sheet. Aluminum is relatively cheap and a liner formed from it may therefore be disposable. Moreover, aluminum is inert to the process. The use of a liner is advantageous because, over time, the walls of the chamber accrue a layer of material formed from the ion beam. As the layer builds up, it deleteriously affects the vacuum pumping rate and introduces the risk of species cross contamination in the wafer to be implanted. By lining the walls of the chamber and then removing the liner and disposing of it on a regular basis, the problems associated with material build up on the chamber wall are alleviated. It will be appreciated that the hinge described herein provides the ready access to the chamber 70 desirable to allow a liner to be used beneficially.

Figure 4:
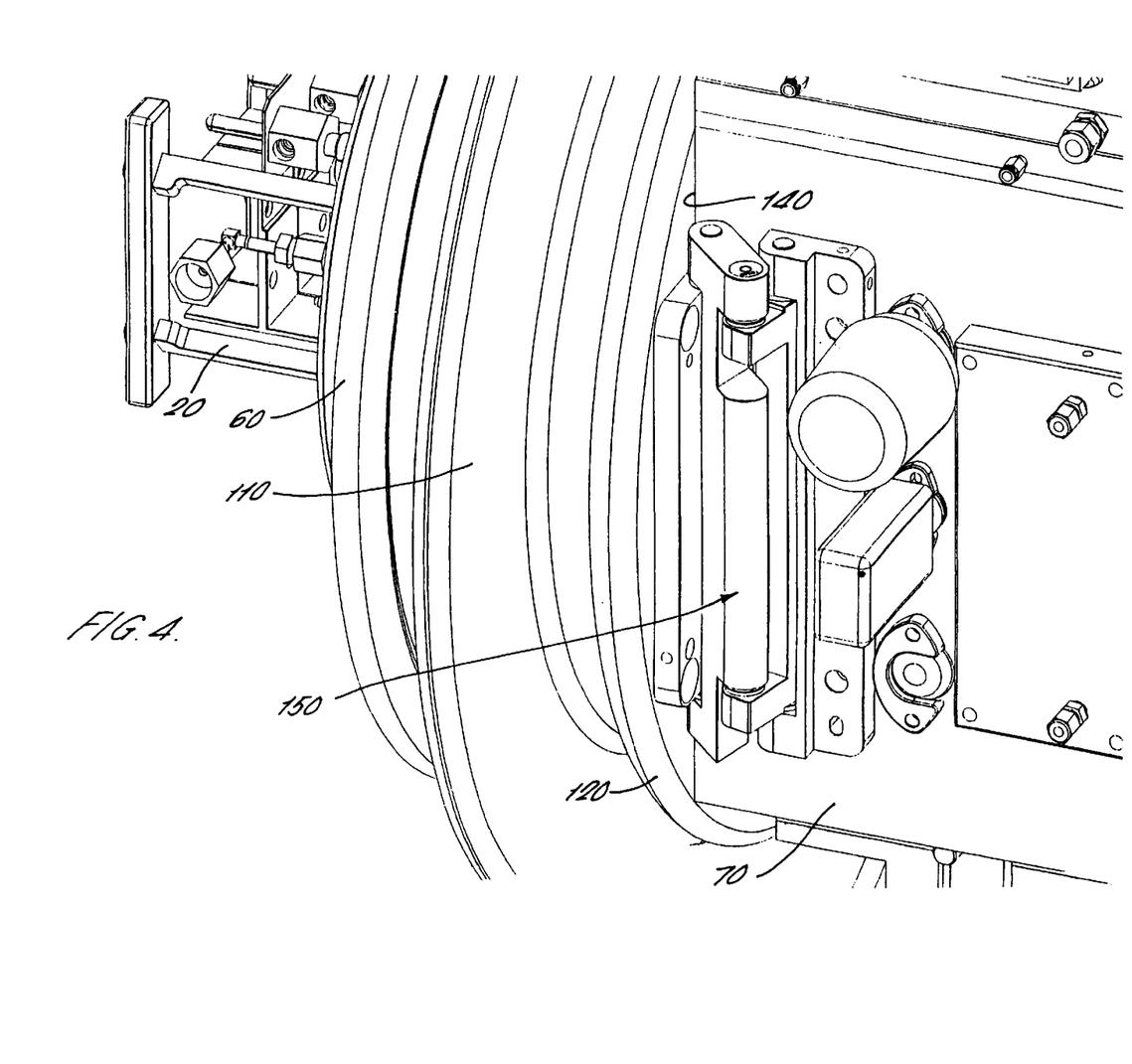
FIG. 4 shows a close up perspective view of the hinge of FIGS. 3a and 3b when in situ.

FIG. 4 shows a close up perspective view of the hinge 150 of FIGS. 2a, 2b, 3a and 3b, in situ.

Figure 5:
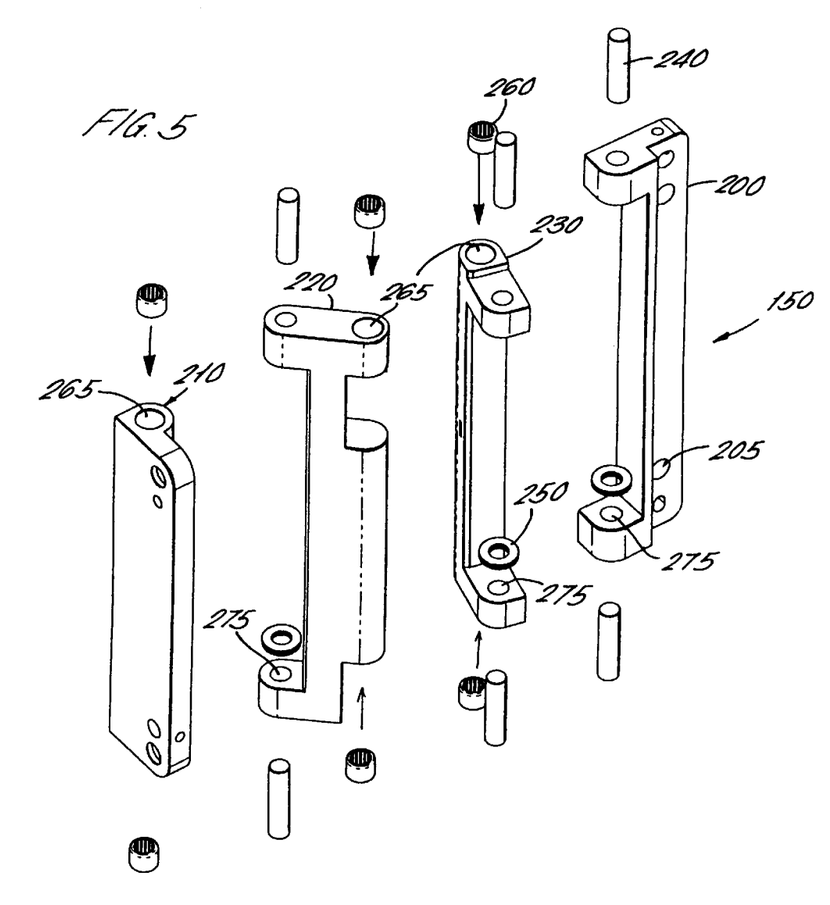
FIG. 5 shows an exploded view of the hinge of FIGS. 3a, 3b and 4.

FIG. 5 shows an exploded view of the hinge 150. As may be seen, the hinge comprises a first hinge part 200 attached in use to the wall of the chamber 70 via screws or bolts (not shown) extending through apertures 205 in the first hinge part. A second hinge part 210 is in use attached in a similar manner to the bushing flange 120.

The first and second hinge parts 200, 210 are linked to each other via two hinge linking members 220,230. Each of the two hinge parts 200,210 and hinge linking members 220,230 which together constitute the hinge 150 are connected together via pins or dowels 240 which slide into cooperating needle bearings 260 inserted into holes 265 formed axially in the upper and lower portions of the second hinge part 210 and in the upper and lower portions of both of the hinge linking members 220,230.

To assemble the hinge 150, needle bearings are first inserted into the axial holes 265 in the second hinge part 210 and in the hinge linking members 220,230. Next, a plurality of thrust bearing assemblies 250, each comprising a needle thrust race and a thrust washer, are aligned with thrust bearing apertures 275 in the lower portions of each of the first hinge part 200 and the first and second hinge linking members 220,230. The second hinge linking member 230 is aligned with the first hinge part 200 and dowels 240 are inserted through the first hinge part 200 to pivotally connect that first hinge part 200 to the second hinge linking member 230.

Next, the first hinge linking member 220 is pivotally attached to the second hinge linking member 230 by inserting dowels 240 through the second hinge linking member 230 into the first hinge linking member 220. Finally, the second hinge part 210 is pivotally connected to the first hinge linking member 220 again by insertion of dowels through the first hinge linking member 220 into the second hinge part 210.

It will be appreciated that the ion source sub assembly 130 has significant mass, and the first and second hinge parts 200,210 as well as the first and second hinge linking members 220,230 are therefore preferably formed of a relatively high tensile material such as aluminum. The hinge 150 is also relatively elongate to provide additional strength.

Whilst the invention has been described in connection with a fixed axis hinge to connect the source sub assembly 130 with the chamber 70, it will be understood that a number of variations are possible. For example, rather than pivoting about a fixed axis, the hinge may instead move through an arc as the source sub assembly 130 moves relative to the chamber 70. In that case, the sub assembly will move axially away from the chamber as well as rotating relative to it. In other words, upon opening the source sub assembly, all of the bushing flange 120 moves away from the chamber, not just those parts away from the hinge itself. This arrangement may be advantageous if the ion source 20 and extraction electrode 40 extend a long way into the chamber; with a fixed point pivot, the ends of these elements might 'catch' upon the wall of the chamber when the source sub assembly 130 is pivoted about the hinge.

Likewise, rather than a single hinge, two or more sliders could be employed to connect the source sub assembly to the chamber. This would allow linear sliding of the former relative to the latter. Whilst this arrangement is not preferred as access to the inside of the chamber is more difficult, it does at least allow support for the bulky source sub assembly during disassembly of the ion source assembly.

Finally, it is to be appreciated that the hinge need not constrain the source sub assembly to move relative to the chamber in a horizontal plane. However, given the weight of the source sub assembly, if the hinge is to allow movement in a vertical plane as well, then a mechanical energy storage device such as a spring or gas strut is desirably mounted between the source sub assembly and chamber. Thus, the decrease in potential energy when the source sub assembly moves downwards relative to the chamber can be stored in the spring or gas strut. Then, when the source sub assembly is to be moved back upwards against gravity, the energy stored in the spring or gas strut can be utilised to assist the person moving it.

Whilst a tetrode structure ion source assembly has been described in the above embodiment, it will of course be understood that the traditional triode structure is also more easily dismantled for cleaning and servicing when a hinge is employed.

What is claimed is:

1. An ion source assembly for an ion implanter comprising:
    a source sub assembly including,
        an ion source for generating ions to be implanted;
        an extraction electrode for extracting ions from the ion source; and
        a first electrical insulator arranged to support the extraction electrode relative to the ion source and to electrically insulate the said extraction electrode from the ion source;
    the ion source assembly further including a chamber having a chamber wall with an inner and outer surface, and being arranged to receive ions extracted from the ion source, the chamber wall defining an exit aperture to permit exiting of the said ions to the ion implanter; wherein
    the source sub assembly is movable relative to the chamber, the ion source assembly further comprising a constraining apparatus arranged to connect the chamber wall with the source sub assembly such that the source sub assembly is constrained to move along a fixed locus of points relative to the chamber to allow access to the inner wall thereof, the fixed locus of points being defined along a substantially horizontal plane.

2. An ion source assembly as claimed in claim 1, wherein the source sub assembly is movable in use between a first position in which it is fixedly mounted upon the chamber walls and a second position in which it is movable relative to the chamber along the said fixed locus of points.

3. An ion source assembly as claimed in claim 2, wherein the constraining apparatus comprises a hinge mounted between the chamber and the source sub assembly.

4. An ion source assembly as claimed in claim 3, in which the hinge constrains the source sub assembly to move along the said fixed locus of points in the said substantially horizontal plane, whereby, in the said first position, the weight of the source sub assembly is borne across the chamber, and in the said second position, the weight of the source sub assembly is substantially all borne by the said hinge.

5. An ion source assembly as claimed in claim 1, further comprising extraction electrode support means arranged to support the said extraction electrode relative to the said first electrical insulator.

6. An ion source assembly as claimed in claim 5, wherein the ion source is generally elongate and has a first end along the axis of elongation, the said first end including an exit aperture permitting exiting of ions, wherein the extraction electrode support means is also elongate with a first end along the axis of elongation, the extraction electrode being mounted upon the said first end of the said extraction electrode support means, and wherein the axes of elongation of the extraction electrode support means and the ion source are generally collinear such that the extraction electrode is located generally parallel with and adjacent to the said exit aperture of the said first end of the ion source.

7. An ion source assembly as claimed in claim 6, in which the said first end of the said ion source constitutes a first electrode, and the said extraction electrode constitutes a second electrode, the assembly further comprising third and fourth electrodes mounted within the said chamber such that the second electrode is located between the first electrode and the third electrode, and the third electrode is located between the second electrode and the fourth electrode.

8. An ion source assembly as claimed in claim 1, further comprising a liner arranged to line at least a part of the said inner surface of the chamber wall.

9. An ion source assembly for an ion implanter comprising:
    a source sub assembly including,
        an ion source for generating ions to be implanted;
        an extraction electrode for extracting ions from the ion source; and
        a first electrical insulator arranged to support the extraction electrode relative to the ion source and to electrically insulate the said extraction electrode from the ion source;
    the ion source assembly further including a chamber having a chamber wall with an inner and outer surface, and being arranged to receive ions extracted from the ion source, the chamber wall defining an exit aperture to permit exiting of the said ions to the ion implanter; wherein the source sub assembly is movable relative to the chamber, the ion source assembly further comprising a constraining apparatus arranged to connect the chamber wall with the source sub assembly such that the source sub assembly is constrained to move along a fixed locus of points relative to the chamber to allow access to the inner wall thereof, at least some of any loss in the potential energy of the source sub assembly during movement thereof being stored by the said constraining apparatus.

10. An ion source assembly as claimed in claim 9, wherein the source sub assembly is movable in use between a first position in which it is fixedly mounted upon the chamber walls and a second position in which it is movable relative to the chamber along the said fixed locus of points.

11. An ion source assembly as claimed in claim 10, wherein the constraining apparatus includes a hinge mounted between the chamber and the source sub assembly.

12. An ion source assembly as claimed in claim 9, further comprising extraction electrode support means arranged to support the said extraction electrode relative to the said first electrical insulator.

13. An ion source assembly as claimed in claim 12, wherein the ion source is generally elongate and has a first end along the axis of elongation, the said first end including an exit aperture permitting exiting of ions, wherein the extraction electrode support means is also elongate with a first end along the axis of elongation, the extraction electrode being mounted upon the said first end of the said extraction electrode support means, and wherein the axes of elongation of the extraction electrode support means and the ion source are generally collinear such that the extraction electrode is located generally parallel with and adjacent to the said exit aperture of the said first end of the ion source.

14. An ion source assembly as claimed in claim 13, in which the said first end of the said ion source constitutes a first electrode, and the said extraction electrode constitutes a second electrode, the assembly further comprising third and fourth electrodes mounted within the said chamber such that the second electrode is located between the first electrode and the third electrode, and the third electrode is located between the second electrode and the fourth electrode.

15. An ion source assembly as claimed in claim 9, further comprising a liner arranged to line at least a part of the said inner surface of the chamber wall.

16. An ion implanter comprising:
(i) an ion source assembly including a source sub assembly having an ion source for generating ions to be implanted, an extraction electrode for extracting ions from the ion source, and a first electrical insulator arranged to support the extraction electrode relative to the ion source and to electrically insulate the said extraction electrode from the ion source; and a chamber having a chamber wall and being arranged to receive ions extracted from the ion source, the chamber wall defining an exit aperture to permit egress of the said ions as an ion beam;
(ii) a substrate holder downstream of the ion source assembly, the ion beam being directed in use towards the said substrate holder, and the substrate holder being arranged to support at least one substrate to be implanted by the said ion beam; and
(iii) constraining apparatus arranged to connect the chamber wall with the source sub assembly such that the source sub assembly is constrained to move along a fixed locus of points relative to the chamber to allow access to the inner wall thereof, the fixed locus of points being defined along a substantially horizontal plane, wherein the source sub assembly of the ion source assembly is movable relative to the chamber thereof.

17. An ion implanter as claimed in claim 16, further comprising mass analysing means arranged between the said ion source assembly and the said substrate holder, the chamber of the said ion source assembly being fixedly mountable relative to the mass analysing means.

18. An ion implanter comprising:
(i) an ion source assembly including a source sub assembly having an ion source for generating ions to be implanted, an extraction electrode for extracting ions from the ion source, and a first electrical insulator arranged to support the extraction electrode relative to the ion source and to electrically insulate the said extraction electrode from the ion source; and a chamber having a chamber wall and being arranged to receive ions extracted from the ion source, the chamber wall defining an exit aperture to permit egress of the said ions as an ion beam;
(ii) a substrate holder downstream of the ion source assembly, the ion beam being directed in use towards the said substrate holder, and the substrate holder being arranged to support at least one substrate to be implanted by the said ion beam; and
(iii) constraining apparatus arranged to connect the chamber wall with the source sub assembly such that the source sub assembly is constrained to move along a fixed locus of points relative to the chamber to allow access to the inner wall thereof, at least some of any loss in the potential energy of the source sub assembly during movement thereof being stored by the said constraining apparatus, wherein the source sub assembly of the ion source assembly is movable relative to the chamber thereof.

19. An ion implanter as claimed in claim 18, further comprising mass analysing means arranged between the said ion source assembly and the said substrate holder, the chamber of the said ion source assembly being fixedly mountable relative to the mass analysing means.

* * * * *